United States Patent
Wei

(10) Patent No.: US 10,989,841 B2
(45) Date of Patent: Apr. 27, 2021

(54) LENS COATING FIXTURE

(71) Applicant: AAC Technologies Pte. Ltd., Singapore (SG)

(72) Inventor: Chuandong Wei, Shenzhen (CN)

(73) Assignee: AAC Optics Solutions Pte. Ltd., Singapore (SG)

(*) Notice: Subject to any disclaimer, the term of this patent is extended or adjusted under 35 U.S.C. 154(b) by 19 days.

(21) Appl. No.: 16/528,630

(22) Filed: Aug. 1, 2019

(65) Prior Publication Data

US 2020/0049859 A1 Feb. 13, 2020

(30) Foreign Application Priority Data

Aug. 10, 2018 (CN) .......................... 201821293983.2

(51) Int. Cl.
*G02B 1/10* (2015.01)
*B05C 13/02* (2006.01)

(52) U.S. Cl.
CPC ................ *G02B 1/10* (2013.01); *B05C 13/02* (2013.01)

(58) Field of Classification Search
None
See application file for complete search history.

(56) References Cited

U.S. PATENT DOCUMENTS

2001/0024327 A1* 9/2001 Fujimoto ............. G02B 3/0075
359/619
2003/0082298 A1* 5/2003 Bauer ................... C23C 14/505
427/162

FOREIGN PATENT DOCUMENTS

CN 102298188 A * 12/2011 ............... G02B 7/02

* cited by examiner

*Primary Examiner* — Jethro M. Pence
(74) *Attorney, Agent, or Firm* — W&G Law Group LLP

(57) ABSTRACT

The present disclosure provides a lens coating fixture which comprises an upper plate and a lower plate disposed opposite to the upper plate and holding the lens to be coated together, the upper plate is provided with a plurality of first lens receiving holes, the lower plate is provided with a second lens receiving hole corresponding to each of the first lens receiving holes, and the upper plate is provided with a recessed portion surrounding the first lens receiving hole, the recessed portion communicating with the first lens receiving hole, the lower plate is provided with a convex portion at a position corresponding to the concave portion, and the convex portion is embedded in the recessed portion and abuts against the object side or the image side of the non-image-forming area of the lens to be coated.

8 Claims, 5 Drawing Sheets

A-A

LENS COATING FIXTURE

FIELD OF THE DISCLOSURE

The present disclosure relates to the field of lens coating, and more particularly to a lens coating fixture.

DESCRIPTION OF RELATED ART

Coating processes are widely applied in the industrial field, which is generally used in the metal machining industry, semiconductor industry, optoelectronic industry and the like. In recent years, due to rapid developments of the semiconductors industry and the optoelectronic industry, the coating techniques are drastically improved. The coating processes mainly refers to a series of coatings to be carried out in a high vacuum degree, which specifically include vacuum ion evaporation, magnetron sputtering, molecular beam epitaxy (MBE), pulsed laser deposition (PLD) and the like. The coating process in the optoelectronic industry refers to coating a single-layer or multi-layer thin film on the surface of an optical element, and implementing focusing, calibration, filtering, reflection and refraction based on an interference effect exerted by light incidence, reflection and transmission on the interface of the thin film. In a lens coating fixture in the related art, lens receiving holes are arranged on a fixture upper plate and a fixture lower plate, and during the coating process of a lens, the lens to be coated is totally placed in the lens receiving holes on the fixture upper plate, then the fixture lower plate is attached and fixed to the fixture upper plate, and finally the lens is coated.

During practice of the present disclosure, the inventors have found that the related art has at least the following problems: During the coating process of the lens, the fixture upper plate and the fixture lower plate tend to be deformed, and the structure of the lens receiving holes may not achieve a better fixing effect for the lens. As such, a plurality of lens placed in a plurality of lens receiving holes may not be securely fixed due to deformations of the fixture upper plate and the fixture lower plate, thereby causing material scattering.

Therefore, it is desired to provide a lens coating fixture to overcome the aforesaid problems.

BRIEF DESCRIPTION OF THE DRAWINGS

Many aspects of the exemplary embodiments can be better understood with reference to the following drawings. The components in the drawing are not necessarily drawn to scale, the emphasis instead being placed upon clearly illustrating the principles of the present disclosure. Moreover, in the drawings, like reference numerals designate corresponding parts throughout the several views.

DETAILED DESCRIPTION

The present disclosure will hereinafter be described in detail with reference to several exemplary embodiments. To make the technical problems to be solved, technical solutions and beneficial effects of the present disclosure more apparent, the present disclosure is described in further detail together with the figure and the embodiments. It should be understood the specific embodiments described hereby is only to explain the disclosure, not intended to limit the disclosure.

Figure 1:
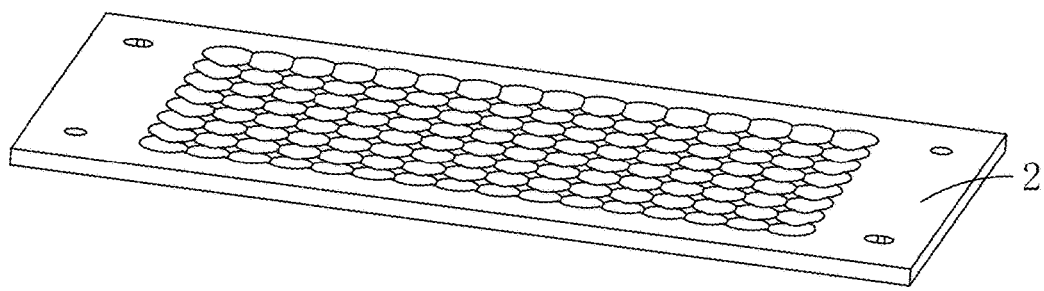
FIG. 1 is a schematic three-dimensional structural view of a lens coating fixture according to a first embodiment of the present disclosure.
Figure 1:
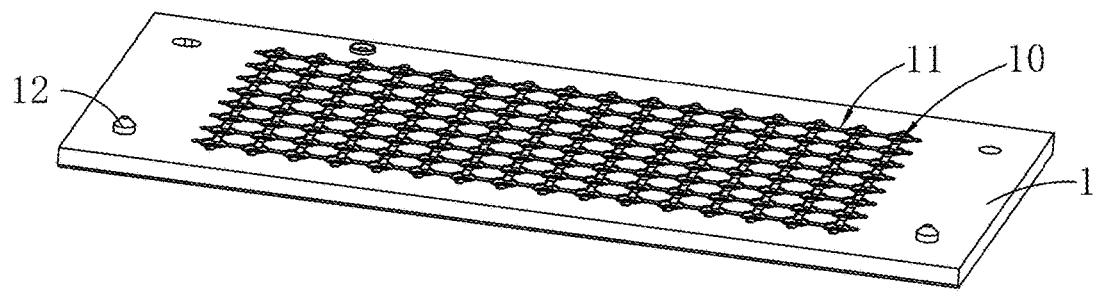
Figure 2:
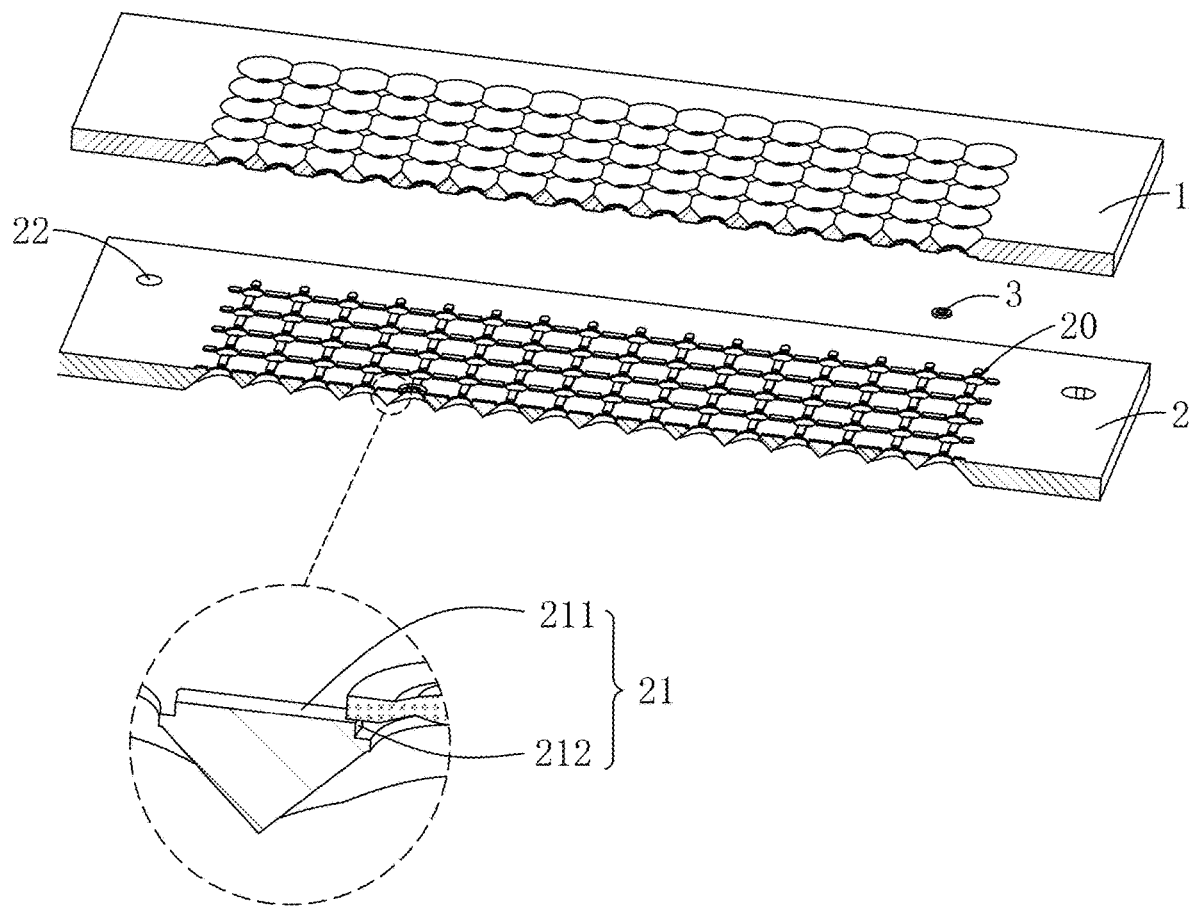
FIG. 2 is a perspective view of a lens coating fixture according to the first embodiment of the present disclosure.
Figure 3:
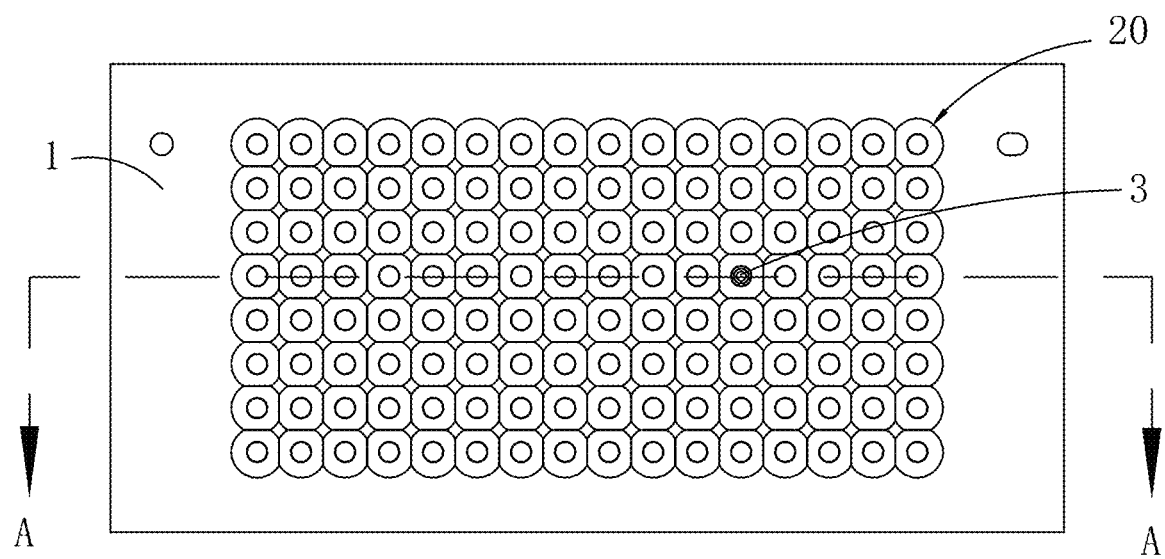
FIG. 3 is a top view of a lens coating fixture according to the first embodiment of the present disclosure.

A first embodiment of the present disclosure relates to a lens coating fixture 100, as illustrated in FIG. 1, FIG. 2 and FIG. 3.

The lens coating fixture 100 includes a fixture upper plate 1 and a fixture lower plate 2 arranged to be opposite to the fixture upper plate 1. The fixture upper plate 1 is provided with a plurality of first lens receiving holes 10. The fixture lower plate 2 is provided with a plurality of second lens receiving holes 20 corresponding to the first lens receiving holes 10. The fixture upper plate 1 is provided with a recess portion 11. A protrusion portion 21 is arranged at a position on the fixture lower plate 2 corresponding to the recess portion 11.

The protrusion portion 21 and the second lens receiving hole 20 are spaced apart from each other. The protrusion portion 21 is configured to be received in the recess portion 11 and abut against an object side 311 or an image side 312 of a non-imaging region 31 when the fixture upper plate 1 and the fixture lower plate 2 are attached. The lens 3 to be coated is attached to an inner wall enclosing the first lens receiving holes 10. A projection of the protrusion portion on the fixture upper plate is at least partially positioned in the first lens receiving holes 10. The second lens receiving holes 20 have an aperture less than that of the lens 3 to be coated.

Relative to the related art, in this embodiment according to the present disclosure, since the fixture upper plate 1 and the fixture lower plate 2 are both provided with lens receiving holes, the lens may be placed on the fixture upper plate 1 or the fixture lower plate 2 for ease of checking the appearance of the lens. In addition, the recess portions 11 are arranged on the fixture upper plate 1, the protrusion portions 21 are arranged at positions of the fixture lower plate 2 corresponding to the recess portions 11, the protrusions 21 are spaced apart from the second lens receiving holes 20, and the protrusion portions 21 are received in the recess portions 11 and abut against the object side 311 or the image side 312 of the non-imaging region 31 when the fixture upper plate 1 and the fixture lower plate 2 are attached. Under such configurations, through the abutting effect between the lens and the protrusion portions 21 and the receiving and fixing effect between the protrusion portions 21 and the recess portions 11, stability between the lens coating fixture 100 and the lens 3 to be coated is improved. Specifically, when the fixture upper plate 1 and the fixture lower plate 2 are deformed, the lens may still be pressed against by the protrusion portions 21 received in the recess portions 11, and material scattering due to failure of the fixing effect of the receiving holes may be prevented, such that material scattering during lens coating may be prevented.

Figure 4:
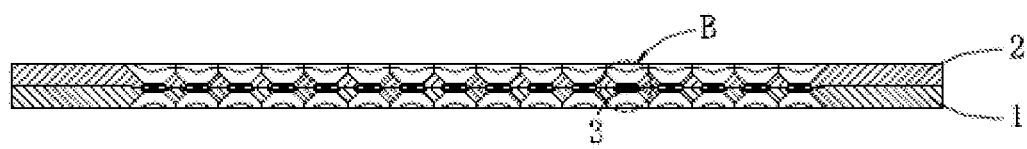
FIG. 4 is a perspective view taken along an A-A side in FIG. 3.
Figure 5:
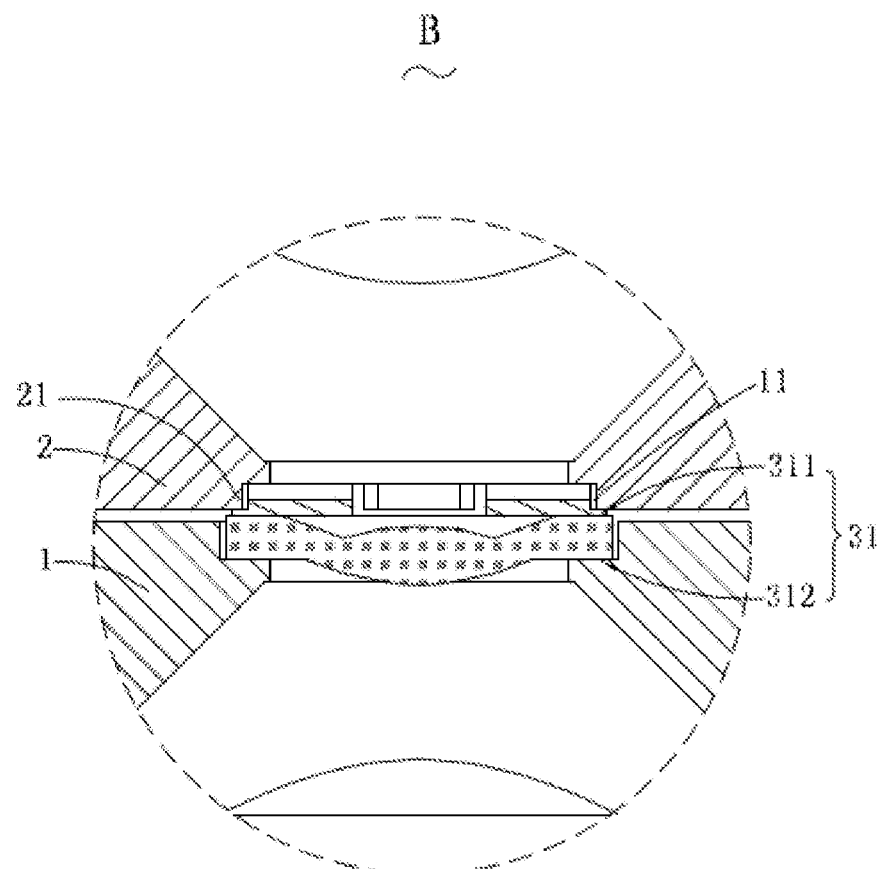
FIG. 5 is an enlarged view of B in FIG. 4.

It should be noted that, as illustrated in FIG. 3, FIG. 4 and FIG. 5, in this embodiment, a plurality of recess portions 11 are arranged and equally spaced apart to surround the first lens receiving holes 10, and a plurality of protrusion portions 21 are arranged and equally spaced apart to surround the second lens receiving holes 20. The recess portions 11 one-to-one correspond to the protrusion portions 20. The plurality of recess portions 11 and protrusion portions 21 are equally spaced apart, such that the lens to be coated suffers from a uniform stress. This prevents the lens to be coated from shaking during operation of the lens coating fixture 100, and improves stability between the lens coating fixture 100 and the lens to be coated. In addition, the recess portions 11 and protrusion portions 21 that are equally spaced apart facilitate operation by the lens coating fixture 100.

It may be readily understood that to further address the problem that material scattering occurs during operation of the lens coating fixture 100 and hence the lens is released from the fixture upper plate 1, in this embodiment, the height of the protrusion portions may be regulated according to the actual needs. By increasing the height of the protrusion portions, the contact area between the protrusion portions 21 and the lens 3 to be coated is increased, such that the abutting effect between the protrusion portions 21 and the lens 3 to be coated is enhanced.

Specifically, each of the plurality of recess portions 11 is in communication with two adjacent first lens receiving holes 10, and each of the plurality of protrusion portions 21 is arranged between two adjacent second lens receiving holes 20. Such configured recess portions 11 feature convenient structural machining, and in the meantime, the lens coating fixture 100 achieves a good appearance effect.

Specifically, the protrusion portion 21 includes an end face 211 distal from the fixture lower plate 2, and a side wall 212 extending from the end face 21 to the fixture lower plate 2. The end face 211 is configured to abut against the object side 311 or the image side 312 of the non-imaging region 31 when the fixture upper plate 1 and the fixture lower plate 2 are attached. It may be understood that in this embodiment, the protrusion portions 21 may be integrally molded with the fixture lower plate 2. The integrally molded protrusion portions 21 fixture lower plate 2 has a stable structure, or the protrusion portions 21 or the fixture lower plate 2 may also be machined separately. Then the protrusion portions 21 are fixed on the fixture lower plate 2. Such configurations simplify a modification process when the height of the protrusion portions 21 needs to be increased. Specifically, the protrusion portions 21 only need to be removed, and higher protrusion portions 21 are mounted.

It should be noted that in this embodiment, a face of the end face 211 configured to abut against the object side 311 or image side 312 is a flat face. Since the object side 311 or the image side 312 of the non-imaging region 31 is also a flat face, such configuration not only increases a contact area between the lens 3 to be coated and the protrusion portions 21, but also leaves no gap between the lens 3 to be coated and the side wall 212. As such, the lens 3 to be coated suffers from a uniform stress, such that the lens 3 to be coated is prevented from being damaged due to a non-uniform stress.

Preferably, the plurality of first lens receiving holes 10 and the plurality of second lens receiving holes 10 are both uniformly arranged to an array.

It should be noted that in this embodiment, the fixture lower plate 2 is provided with a catch hole 22, and the fixture upper plate is provided with a catch portion 12. When the fixture upper plate 1 and the fixture lower plate 2 are attached, the catch portion 12 is caught in the catch hole 22. A person skilled in the art would understand that the catch portion 12 may also be arranged on the fixture lower plate 2, and the catch hole 22 may also be arranged on the fixture upper plate 1, which does not affect the effect of the present disclosure. Through the catch portion 12 and the catch hole 22, the fixture upper plate 1 and the fixture lower plate 2 may be conveniently connected, such that subsequent coating is eased, manpower is reduced, and working efficiency is improved.

It is to be understood, however, that even though numerous characteristics and advantages of the present embodiments have been set forth in the foregoing description, together with details of the structures and functions of the embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A lens coating fixture, comprising: a fixture upper plate and a fixture lower plate that is arranged to be opposite to the fixture upper plate and clamps a lens to be coated together with the fixture upper plate, the fixture upper plate being provided with a plurality of first lens receiving holes, and the fixture lower plate being provided with a plurality of second lens receiving holes corresponding to the plurality of first lens receiving holes; wherein the fixture upper plate is provided with a plurality of recess portions arranged spaced along the circumferential direction of each of the plurality of first lens receiving holes, the plurality of recess portions being in communication with the plurality of first lens receiving holes; a plurality of protrusion portions are arranged at positions of the fixture lower plate one-to-one corresponding to the plurality of recess portions, the plurality of protrusion portions being configured to be received in the plurality of recess portions and abut against an object side or an image side of a non-imaging region of the lens to be coated when the fixture upper plate and the fixture lower plate are attached; the lens to be coated is attached to an inner wall enclosing the plurality of first lens receiving holes; and a projection on the fixture upper plate of each of the plurality of protrusion portions is at least partially positioned in each of the plurality of first lens receiving holes, each of the plurality of protrusion portions comprises an end face distal from the fixture lower plate, and a side wall extending from the end face to the fixture lower plate, the side wall is perpendicular to the fixture lower plate.

2. The lens coating fixture as described in claim 1, wherein the plurality of recess portions are equally spaced along the circumferential direction of the plurality of first lens receiving holes, and the plurality of protrusion portions are equally spaced along the circumferential direction of the plurality of second lens receiving holes.

3. The lens coating fixture according to claim 2, wherein each of the plurality of recess portions is in communication with two adjacent first lens receiving holes of the plurality of first lens receiving holes, and each of the plurality of protrusion portions is arranged between two adjacent second lens receiving holes of the plurality of second lens receiving holes.

4. The lens coating fixture according to claim 1, wherein the end face is configured to abut against the object side or the image side when the fixture upper plate and the fixture lower plate are attached.

5. The lens coating fixture according to claim 4, wherein a face of the end face configured to abut against the object side or image side is a flat face.

6. The lens coating fixture according to claim 1, wherein the plurality of first lens receiving holes and the plurality of second lens receiving holes are both uniformly arranged to an array.

7. The lens coating fixture according to claim 1, wherein one of the fixture upper plate and the fixture lower plate is provided with a catch portion, and the other of the fixture upper plate and the fixture lower plate is provided with a catch hole, the catch portion being caught in the catch hole when the fixture upper plate and the fixture lower plate are attached.

8. The lens coating fixture according to claim 1, wherein the plurality of protrusion portions and plurality of the second lens receiving holes are spaced apart from each other.

\* \* \* \* \*